United States Patent
Hensley et al.

(10) Patent No.: US 10,439,307 B2
(45) Date of Patent: Oct. 8, 2019

(54) CUTS IN A CIRCUIT BOARD

(71) Applicant: Hewlett Packard Enterprise Development LP, Houston, TX (US)

(72) Inventors: James D. Hensley, Rocklin, CA (US); David G. Rohrer, Auburn, CA (US); Brent A. Ford, Roseville, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 253 days.

(21) Appl. No.: 15/660,612

(22) Filed: Jul. 26, 2017

(65) Prior Publication Data

US 2019/0036248 A1 Jan. 31, 2019

(51) Int. Cl.

| H01R 12/70 | (2011.01) |
|---|---|
| H01R 12/71 | (2011.01) |
| H05K 1/02 | (2006.01) |
| H05K 7/20 | (2006.01) |
| H05K 1/14 | (2006.01) |
| H05K 3/30 | (2006.01) |
| H01R 12/72 | (2011.01) |

(52) U.S. Cl.
CPC ....... *H01R 12/7005* (2013.01); *H01R 12/716* (2013.01); *H05K 1/0278* (2013.01); *H05K 1/147* (2013.01); *H05K 3/303* (2013.01); *H05K 7/20172* (2013.01); *H01R 12/722* (2013.01); *H05K 2201/064* (2013.01); *H05K 2201/09063* (2013.01); *H05K 2201/09081* (2013.01); *H05K 2201/10333* (2013.01); *H05K 2203/0228* (2013.01)

(58) Field of Classification Search
CPC .............. H01R 12/7005; H01R 12/716; H01R 12/722; H05K 1/0278; H05K 1/147; H05K 3/303; H05K 7/20172; H05K 2201/064; H05K 2201/09063; H05K 2201/09081; H05K 2201/10333; H05K 2203/0228
See application file for complete search history.

(56) References Cited

U.S. PATENT DOCUMENTS

| 5,482,474 A * | 1/1996 | Yohn ................... H05K 3/3405 439/289 |
|---|---|---|
| 6,388,880 B1 | 5/2002 | El-Ghobashy et al. |
| 7,054,155 B1 | 5/2006 | Mease et al. |
| 8,025,515 B2 | 9/2011 | Diaz |

(Continued)

FOREIGN PATENT DOCUMENTS

WO WO-2017074351 A1 5/2017

OTHER PUBLICATIONS

Molex Inc., "Self-Aligning Molex Spox BMI Connectors Save Time, Offer Design Flexibility", Jul. 5, 2017, Heilind Asia Pacific (HK) LTD, www.heilind.com, 1 page.

*Primary Examiner* — Abdullah A Riyami
*Assistant Examiner* — Nader J Alhawamdeh
(74) *Attorney, Agent, or Firm* — Brooks, Cameron & Huebsch, PLLC

(57) ABSTRACT

Examples herein relate to cuts in a circuit board. In some examples, a circuit board can include a signal connector located on the circuit board, and cuts extending through at least a body of the circuit board that are adjacent to the signal connector and extend from a perimeter of the circuit board to an inner portion of the circuit board, where the circuit board flexes relative to the signal connector responsive to the circuit board experiencing a force.

20 Claims, 4 Drawing Sheets

(56) References Cited

U.S. PATENT DOCUMENTS

| | | |
|---|---|---|
| 8,508,941 B2 | 8/2013 | Simon et al. |
| 9,461,378 B1* | 10/2016 | Chen .................. H01R 12/707 |
| 10,094,994 B2* | 10/2018 | Leigh ..................... G02B 6/32 |
| 2004/0123458 A1* | 7/2004 | Korsunsky .......... H01R 23/688 |
| | | 29/874 |
| 2005/0276547 A1* | 12/2005 | Wang ................. G02B 6/4201 |
| | | 385/92 |
| 2008/0062640 A1* | 3/2008 | Anderl ................ H04B 10/806 |
| | | 361/690 |
| 2009/0011624 A1* | 1/2009 | Yamazaki .............. H01R 9/034 |
| | | 439/99 |
| 2010/0151709 A1* | 6/2010 | Busse ..................... H01R 9/15 |
| | | 439/78 |
| 2010/0159727 A1* | 6/2010 | Chang .................. H01R 4/027 |
| | | 439/294 |
| 2010/0302746 A1* | 12/2010 | Wing ............... B29C 45/14639 |
| | | 361/760 |
| 2011/0143557 A1* | 6/2011 | Kuo ................... H01R 13/5833 |
| | | 439/55 |
| 2011/0281457 A1* | 11/2011 | Hsieh ..................... H01R 13/73 |
| | | 439/374 |
| 2012/0164874 A1* | 6/2012 | Yu ....................... H01R 12/716 |
| | | 439/485 |
| 2012/0304455 A1* | 12/2012 | Schuette ................ G06F 1/187 |
| | | 29/604 |
| 2013/0284682 A1* | 10/2013 | Rohrer ................ H05K 7/1425 |
| | | 211/26.2 |
| 2016/0081221 A1* | 3/2016 | Neer .................... G02B 6/4246 |
| | | 439/78 |
| 2016/0268713 A1* | 9/2016 | Norton ............... G06F 13/4068 |
| 2017/0322605 A1* | 11/2017 | Potter ..................... G06F 1/187 |
| 2018/0106975 A1* | 4/2018 | Norton ................ G02B 6/3825 |
| 2018/0225487 A1* | 8/2018 | Leigh ................. G02B 6/4201 |

* cited by examiner

CUTS IN A CIRCUIT BOARD

BACKGROUND

Electronic devices may include a circuit board such as a printed circuit board (PCB). Electrical components of the electronic device may be coupled to the PCB. For instance, the electrical components may include a connector to couple the electrical components to a via of a circuit board. The via may be plated-through holes that are connected to trace layers in the circuit board. As such, the electrical components can be electrically and mechanically coupled to the circuit board and enable various functions of the electronic device.

DETAILED DESCRIPTION

Figure 1:
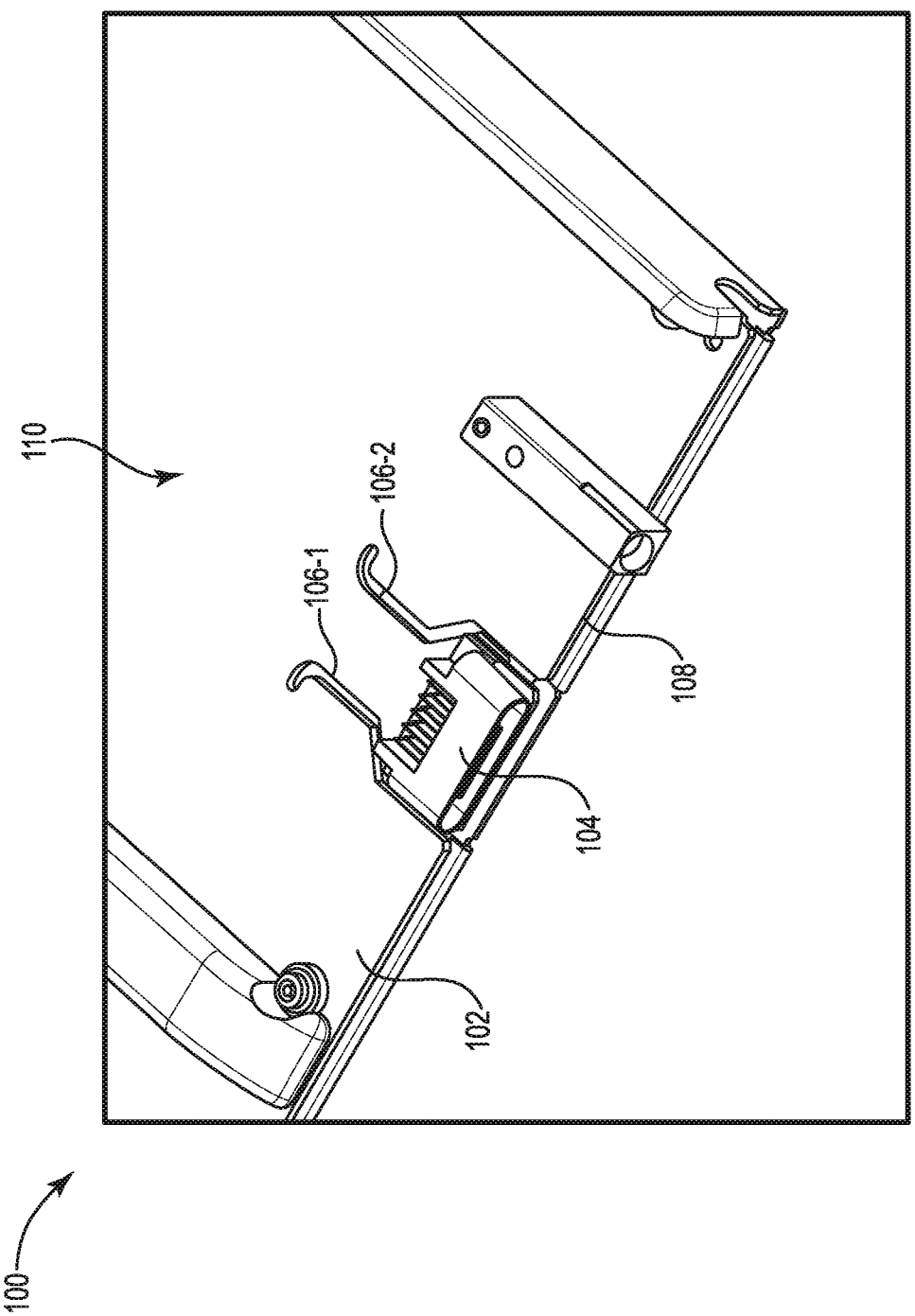
FIG. 1 illustrates a perspective view of an example of a circuit board with cuts consistent with the disclosure.

Electrical components can be electrically and mechanically coupled to the circuit board of the electronic device. For instance, an electronic device may include various signal connectors to couple to additional devices and/or couple to various cables that are external to the electronic device. As used herein, a signal connector refers to an electro-mechanical connector. Examples of a signal connector can include pin-to-pin connectors such as module to backplane connectors, module to mid-plane connectors, module to module connectors, power interconnects, signal interconnects, and/or daughtercard connectors, among other types of signal connectors.

Signal connectors may be subject to stress during an operational lifetime of an electronic device. For instance, signal connectors may be subject to flexing forces due to vibration and/or other forces imparted on the signal connectors. Such flexing forces can be particularly evident when the signal connector is coupled to an additional device and/or cable. As used herein, the term "flexing" can, for example, refer to bending or rotating. The signal connectors may be damaged and/or be mechanically and/or electrically decoupled from the circuit board by the flexing forces and therefore may not function as intended. As used herein, the term "damaged" can, for example, refer to a harm experienced by the signal connector and/or electrical traces on or in the circuit board connected to the signal connector as a result of flexing or other actions that can cause the signal connector to function improperly. As such, some approaches have attempted to prevent or mitigate the effects of stress on the signal connectors through replacement with a more robust replacement signal connector having a thicker housing and/or having various mechanical fasteners (e.g., screws, bolts, etc.) which may affix the replacement signal connector to a circuit board. However, such replacement may be time consuming, expensive, and/or impractical due to geometrical or other mechanical constraints.

Accordingly, the disclosure is directed to cuts in a circuit board. The cuts in the circuit board can define a portion of the circuit board that may not flex or flex less than the remaining portion of the circuit board when the remaining portion of the circuit board does flex, or may flex or flex more than the remaining portion of the circuit board when the remaining portion of the circuit board does not flex. The circuit board can include a signal connector that can be located on the portion of the circuit board defined by the cuts in the circuit board. In various examples according to the disclosure, the signal connector may be connected to a different signal connector of a different circuit board. In some examples, the cuts defining the portion of the circuit board with the signal connector can allow for that portion of the circuit board with the signal connector to not flex or flex less than the remaining portion of the circuit board when the remaining portion of the circuit board flexes in response to the circuit board experiencing a force. By preventing and/or mitigating the portion of the circuit board with the signal connector from flexing via the cuts, the signal connector and/or electrical traces on or in the circuit board connected to the signal connector may not be damaged as a result of the force on the circuit board that causes the circuit board to flex.

FIG. 1 illustrates a perspective view of an example of a circuit board 100 with cuts 106 consistent with the disclosure. Circuit board 100 can include a body 102, a signal connector 104, cuts 106-1, 106-2 (referred to collectively as cuts 106), perimeter 108, and inner portion 110.

Circuit board 100 can include signal connector 104 located on circuit board 100. As used herein, the term "circuit board" can, for example, refer to a device that mechanically supports and electrically connects electronic components using conductive tracks, pads, and/or other features. A circuit board can be a printed circuit board assembly (PCBA), among other possibilities. Examples of PCBs can include single sided PCB, double sided PCB, and/or multi-layered PCBs, among other types of PCBs. As used herein, a PCBA refers to PCB that has undergo post processing such as printing of solder paste on the PCB and/or undergone mounting of various electrical components such as capacitors, resistors, integrated circuits, among other types of electrical components. Signal connector 104 can be a pin-to-pin signal connector, among other types of signal connectors.

A circuit board, such as circuit board 100, can include or can be coupled to an operation system (not shown). That is, in various examples, circuit board 100 can include an operating system which can cause a device including circuit board 100 to perform a variety of functions. In some examples, circuit board 100 can include a power source (not shown) such as source of direct current (DC) and/or a source of alternating current (AC). Examples of power sources include batteries, AC/DC power converters, and/or DC/AC power converters, among other types of power sources.

As illustrated in FIG. 1, signal connector 104 can be located adjacent to a perimeter 108 of circuit board 100. For example, signal connector 104 can be located adjacent to perimeter 108 of circuit board 100 to allow signal connector 104 to couple to additional devices and/or couple to various cables that may be external to circuit board 100.

Although signal connector 104 is described as being adjacent to perimeter 108 of circuit board 100, examples of the disclosure are not so limited. For example, signal connector 104 can be proximate to perimeter 108 of circuit board 100. Proximity to perimeter 108 may allow for easier connectivity with additional devices and/or external cables relative to a signal connector located farther away from perimeter 108 of circuit board 100.

Circuit board 100 can include cuts 106. Cuts 106 can extend through at least a body 102 of circuit board 100. As used herein, the term "cut" can, for example, refer to a void, a gap, or an opening in a piece of material, such as a void, a gap, or an opening in a circuit board.

Cuts 106 can be adjacent to signal connector 104. As used herein, the term "adjacent" can, for example, refer to being near or close. For example, cuts 106 can be close to signal connector 104. Cuts 106 can be adjacent to signal connector 104 for the length of signal connector 104.

Cuts 106 can extend from perimeter 108 of circuit board 100 to an inner portion 110 of circuit board 100. As used herein, the term "perimeter" can, for example, refer to an outer boundary of a two-dimensional object. For example, perimeter 108 of circuit board 100 can be an outer boundary of circuit board 100. Perimeter 108 can be located adjacent to a different circuit board that can include a different signal connector that can be coupled to signal connector 104, as is further described in connection with FIG. 3.

As illustrated in FIG. 1, cuts 106 can extend from perimeter 108 of circuit board 100 to inner portion 110 of circuit board 100. For instance, cuts 106 can extend from perimeter 108 and past the length of signal connector 104 to inner portion 110. In other words, cuts 106 can extend lengthwise (e.g., to inner portion 110) a distance that may be longer than the length of signal connector 104.

Although cuts 106 are described above and illustrated in FIG. 1 as extending lengthwise longer than the length of signal connector 104, examples of the disclosure are not so limited. For example, cuts 106 can be the same length as signal connector 104 or shorter than the length of signal connector 104, among other lengths.

Cuts 106 in circuit board 100 can extend through an entire thickness of body 102 of circuit board 100. For example, cuts 106 can extend through all of the layers that make up body 102 of circuit board 100. In various examples, circuit board 100 may be coupled to a frame. In some examples, the frame does not include cuts similar to cuts 106. In some examples, the frame does include cuts similar to cuts 106.

As illustrated in FIG. 1, cuts 106 in circuit board 100 can include a first cut 106-1 and a second cut 106-2. First cut 106-1 and second cut 106-2 can define a portion of circuit board 100 that may not flex or flex less than the remaining portion of circuit board 100 when the remaining portion of circuit board 100 does flex in response to circuit board 100 experiencing a force, as is further described herein.

First cut 106-1 and second cut 106-2 can be substantially parallel to each other. For example, portions of first cut 106-1 and portions of second cut 106-2 can be in a parallel orientation relative to each other. As used herein, the term "substantially" can, for example, intend that the characteristic is not absolute, but is close enough so as to achieve the advantages of the characteristic. For example, "substantially parallel" features is not limited to absolute parallelism, and can include orientations that are intended to be parallel but due to manufacturing limitations may not be precisely parallel. For example, "substantially parallel" features are at least closer to a parallel orientation than a perpendicular orientation, and are generally formed within a few degrees of parallel.

First cut 106-1 and second cut 106-2 can be substantially the same shape. For example, as illustrated in FIG. 1, first cut 106-1 can include a first straight portion extending from perimeter 108 substantially the length of signal connector 104, an angled portion relative to the first straight portion that extends towards second cut 106-2, a second straight portion extending into inner portion 110, and a curved portion. Second cut 106-2 can include substantially the same shape as first cut 106-1, but can be "mirrored" from first cut 106-1. As used herein, the term "mirrored" can, for example, refer to a first object having a spatial arrangement that corresponds to that of a second object except that the right-to-left sense on the first object corresponds to the left-to-right sense on the second object.

Although first cut 106-1 and second cut 106-2 are illustrated in FIG. 1 as including include substantially the same shape defined by a first straight portion an angled portion relative to the first straight portion, a second straight portion and a curved portion, examples of the disclosure are not so limited. For example, first cut 106-1 and second cut 106-2 can be orthogonal cuts relative to perimeter 108, angled cuts relative to perimeter 108, or any other shape.

The shape of cuts 106 can be based on an application of circuit board 100. For example, circuit board 100 may be used in different applications, for instance in an access point (AP) and/or a network switch, among other applications. The shape of cuts 106 may depend on the type of signal connector 104, the thickness of circuit board 100, and/or the circuitry layout of circuit board 100, among other factors, which can depend on the application of circuit board 100.

Cuts 106 in circuit board 100 extending from perimeter 108 to inner portion 110 can be the same length. For example, first cut 106-1 and second cut 106-2 can both extend a total length of one centimeter from perimeter 108 to inner portion 110, among other lengths of cuts 106.

In some examples, cuts 106 in circuit board 100 extending from perimeter 108 to inner portion 110 can be different lengths. For example, first cut 106-1 can extend one centimeter from perimeter 108 to inner portion 110 and second cut 106-2 can extend two centimeters from perimeter 108 to inner portion 110, among other lengths of first cut 106-1 and second cut 106-2.

Cuts 106 can define a tongue in circuit board 100. Signal connector 104 can be located on the tongue of circuit board 100 defined by cuts 106. As used herein, the term "tongue" can, for example, refer to an isolated strip of material included as a portion of a total piece of material such that the strip of material can flex in a different manner from the total piece of material. The remaining portion of circuit board 100 can flex relative to the tongue of circuit board 100 in response to circuit board 100 experiencing a force, as is further described with respect to FIGS. 2 and 3.

Figure 2:
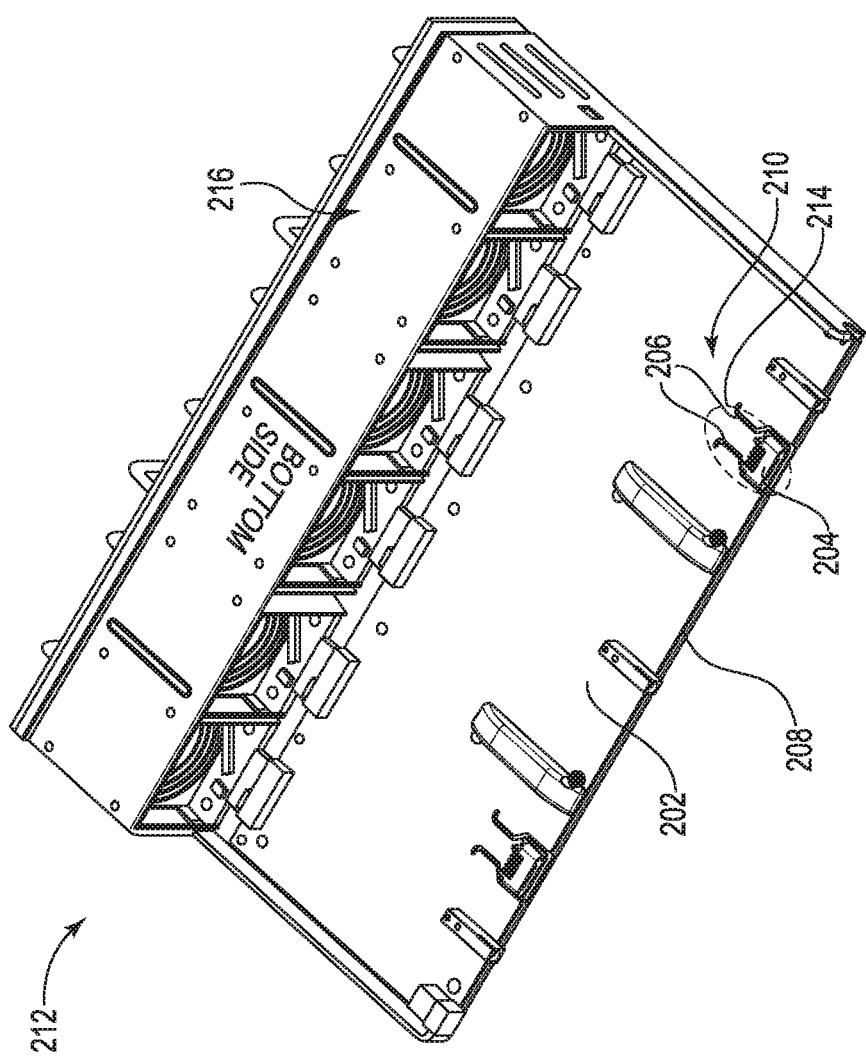
FIG. 2 illustrates a perspective view of an example of a circuit board with cuts consistent with the disclosure.

FIG. 2 illustrates a perspective view of an example of a circuit board 212 with cuts 206 consistent with the disclosure. Circuit board 212 can include body 202, signal connector 204, cuts 206, perimeter 208 of circuit board 212, inner portion 210 of circuit board 212, tongue 214, and fan 216.

As illustrated in FIG. 2, circuit board 212 can include signal connector 204. As described in connection with FIG. 1, signal connector 204 can be located on circuit board 212.

Circuit board 212 can include cuts 206. Cuts 206 can be adjacent to signal connector 204 and can extend from perimeter 208 of circuit board 212 to inner portion 210 of circuit board 212. In other words, cuts 206 can be longer than the length of signal connector 204, although as described in connection with FIG. 1, examples of the disclosure are not limited to cuts 206 being longer than the length of signal connector 204.

Cuts 206 can define tongue 214 of circuit board 212. Cuts 206 in circuit board 212 can extend from perimeter 208 to inner portion 210 of circuit board 212 to define tongue 214.

Signal connector 204 can be located on tongue 214 of circuit board 212 such that circuit board 212 can flex relative to tongue 214 that includes signal connector 204. For example, circuit board 212 can rotate relative to tongue 214.

Circuit board 212 can flex relative to tongue 214 that includes signal connector 204 in response to circuit board 212 experiencing a force. As used herein, the term "force" can, for example, refer to an interaction on an object that, when unopposed, can change the motion of the object. For example, body 202 of circuit board 212 can experience a force which may cause body 202 to rotate. Body 202 can flex relative to tongue 214 in response to the force. In other words, tongue 214 can experience less rotation if tongue 214 is fixed in response to the force relative to the remaining portions of circuit board 212, or tongue 214 can experience more rotation if circuit board 212 is fixed in response to the force relative to the remaining portions of circuit board 212.

Circuit board 212 can include fan 216. As used herein, the term "fan" can, for example, refer to a device to create an air flow, such as by utilizing a rotating arrangement of vanes or blades which act on air located close to the vanes or blades to cause the air to flow as a result of volume and pressure changes to the environment surrounding the air.

As illustrated in FIG. 2, circuit board 212 can include a plurality of fans 216. The plurality of fans 216 can make up an array. The array of fans 216 can be used to cool electrical components, such as circuit board 212. For example, circuit board 212 may be included in a network switch. During operation of the network switch, components of the network switch, such as circuit board 212, may experience heat generation and have to be cooled. Fans 216 can cool heated electrical components to prevent premature wear, damage, and/or failure of the electrical components.

In some examples, circuit board 212 can experience a force as a result of the weight of fans 216. For instance, fans 216 may cause a force to be experienced by circuit board 212, Body 202 of circuit board 212 may rotate in response to the force experienced by circuit board 212 caused by the weight of fans 216. Body 202 can rotate relative to tongue 214 in response to the force such that tongue 214 can experience less rotation relative to the remaining portions of circuit board 212.

Figure 3:
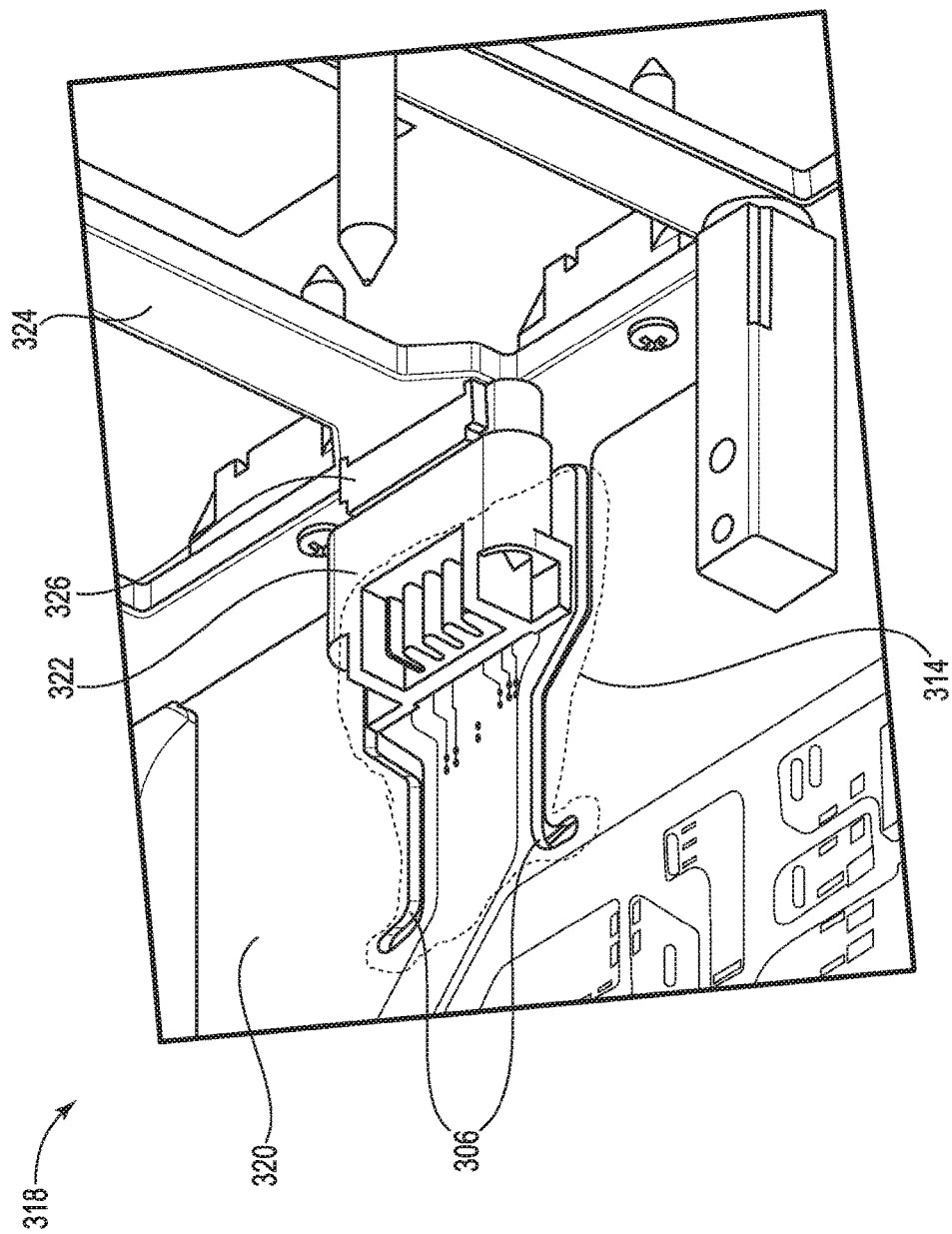
FIG. 3 illustrates a perspective view of an example of a device including a first circuit board with cuts and a second circuit board consistent with the disclosure.

Although circuit board 212 is illustrated in FIG. 3 as including fans 216, examples of the disclosure are not so limited. For example, circuit board 212 can include other components that may have weight sufficient to cause circuit board 212 to experience a force.

FIG. 3 illustrates a perspective view of an example of a device 318 including a first circuit board 320 with cuts 306 and a second circuit board 324 consistent with the disclosure. First circuit board 320 can include first signal connector 322, tongue 314, and cuts 306. Second circuit board 324 can include second signal connector 326.

First circuit board 320 can include first signal connector 322. First signal connector 322 can be located on first circuit board 320.

First circuit board 320 can include cuts 306. Cuts 306 can extend through an entire thickness of first circuit board 320 and can be adjacent to first signal connector 322. For example, cuts 306 can extend from a perimeter of first circuit board 320 adjacent to first signal connector 322 and into first circuit board 320.

Although cuts 306 are described as extending through an entire thickness of first circuit board 320, examples of the disclosure are not so limited. For example, cuts 306 can extend partially through a thickness of first circuit board 320. For instance, cuts 306 can extend through a layer or multiple layers of first circuit board 320, but not through all of the layers of first circuit board 320.

Cuts 306 can define tongue 314 of first circuit board 320. First signal connector 322 can be located on tongue 314 of first circuit board 320 such that a remaining portion of first circuit board 320 can flex relative to tongue 314 that includes first signal connector 322, as is further described herein.

Second circuit board 324 can include second signal connector 326. Second signal connector 326 can connect to first signal connector 322. For example, second signal connector 326 and first signal connector 322 can be coupled such that an electrical connection can be formed between second signal connector 326 and first signal connector 322.

Second circuit board 324 can be oriented substantially orthogonally relative to first circuit board 320 when second signal connector 326 is connected to first signal connector 322. For example, second circuit board 324 and first circuit board 320 can be oriented at or substantially at a right angle to each other when second signal connector 326 is connected to first signal connector 322.

In some examples, second circuit board 324 can be oriented in a planar or a substantially planar orientation relative to first circuit board 320 when second signal connector 326 is connected to first signal connector 322. For instance, second circuit board 324 can be oriented in a planar or substantially planar orientation relative to first circuit board 320 when second signal connector 326 is connected to first signal connector 322.

Although second circuit board 324 is described as being oriented substantially orthogonally or oriented in a substantially planar orientation relative to first circuit board 320 when second signal connector 326 is connected to first signal connector 322, examples of the disclosure are not so limited. For example, second circuit board 324 can be oriented at any other angle relative to first circuit board 320 when second signal connector 326 is connected to first signal connector 322.

As illustrated in FIG. 3, trace electrical connections connecting first signal connector 322 to electrical components of first circuit board 320 can be routed around cuts 306. Electrical traces may be routed around cuts 306 so that electrical connections in first circuit board 320 may be maintained from first signal connector 322 to other electrical components of first circuit board 320.

First circuit board 320 may comprise a first portion shown as tongue 314 and a remaining second portion. The remaining second portion of first circuit board 320 can flex relative to tongue 314 in response to first circuit board 320 experiencing a force. The remaining second portion of first circuit board 320 can flex relative to tongue 314 such that the trace electrical connections connecting first signal connector 322 to electrical components of first circuit board 320, first signal connector 322, and/or electrical connections between the trace electrical connections and first signal connector 322 are not damaged when the remaining portion of first circuit board 320 flexes relative to tongue 314.

In some examples, first circuit board 320 may flex by five millimeters in response to first circuit board 320 experiencing a force. As a result of first circuit board 320 experiencing the force, tongue 314 may flex two millimeters. As a result of the tongue 314 flexing a smaller amount relative to the remaining portion of first circuit board 320, the trace electrical connections may not be damaged as a result of the force experienced by first circuit board 320.

Figure 4:
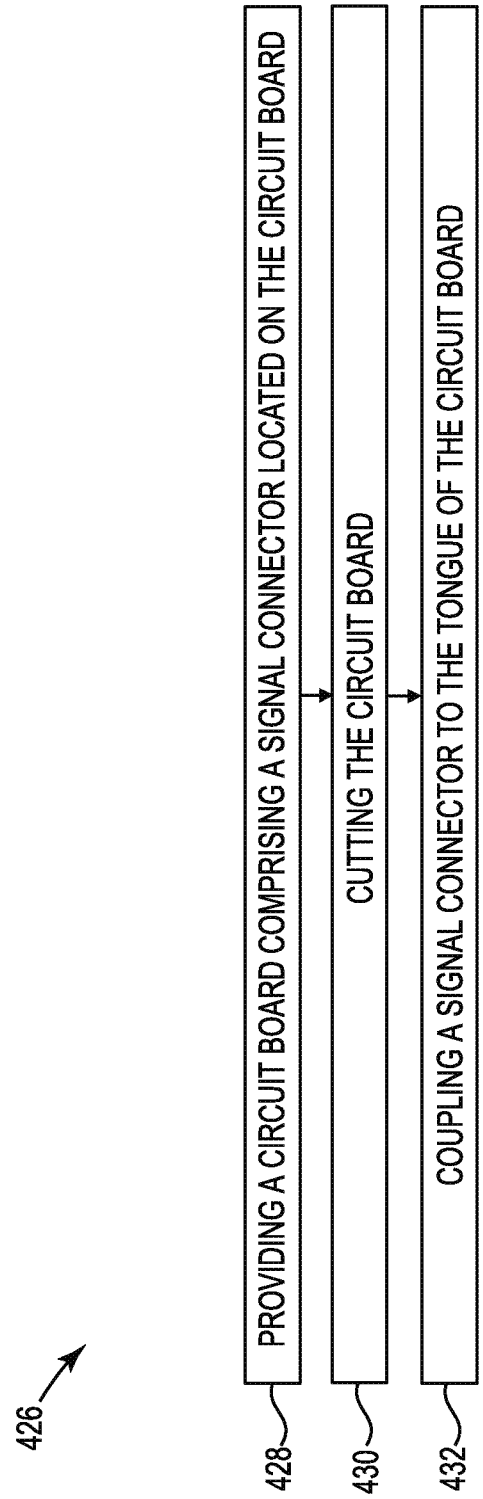
FIG. 4 illustrates an example of a method to provide cuts in a circuit board consistent with the disclosure.

FIG. 4 illustrates an example of a method 426 to provide cuts in a circuit board consistent with the disclosure. At 428, the method 426 can include providing a circuit board comprising a signal connector located on the circuit board.

In various examples, a circuit board (e.g., first circuit board 320, previously described in connection with FIG. 3) comprising a signal connector (e.g., first signal connector 322, previously described in connection with FIG. 3) located on the circuit board and cuts (e.g., cuts 306, previously described in connection with FIG. 3) extending through at least a body of the circuit board that are adjacent to the signal connector and extend from a perimeter of the circuit board to an inner portion of the circuit board, where the circuit board flexes relative to the signal connector in response to the circuit board experiencing a force. As used herein, the term "providing" refers to manufacture or procurement of an unassembled component intended for assembly into a larger system including a plurality of components such as a device including those described herein.

At 430, the method 426 can include cutting the circuit board. For instance, the method can include cutting the circuit board in prescribed cut paths in order to create a tongue of the circuit board.

At 432, the method 426 can include coupling a signal connector to the tongue of the circuit board. For instance, the tongue of the circuit board can be a portion of the circuit board around which cuts may be prescribed.

Notably, in some examples, the signal connector can be coupled to the circuit board without the use of an adhesive or other type of permanent non-removable mechanism. This can permit removal of the signal connector from the circuit board as an intended application and/or demand on the circuit board changes. However, in some examples, a permanent mechanism such as solder or adhesive can be employed to couple the signal connector to the circuit board in a manner intended to be a non-removable.

Cuts in a circuit board, according to the disclosure, can allow for movement of a circuit board as a result of the circuit board experiencing a force, without signal connectors and/or their corresponding electrical connections being damaged as a result of the force. Cuts in the circuit board can provide a way to mitigate or prevent the flexing experienced by signal connectors of the circuit board without added design complexity and/or cost.

It can be understood that when an element is referred to as being "on," "connected to", "coupled to", or "coupled with" another element, it can be directly on, connected, or coupled with the other element or intervening elements may be present. In contrast, when an object is "directly coupled to" or "directly coupled with" another element it is understood that are no intervening elements (adhesives, screws, other elements) etc.

In the foregoing detailed description of the disclosure, reference is made to the accompanying drawings that form a part hereof, and in which is shown by way of illustration how examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the disclosure. Further, as used herein, "a" can refer to one such thing or more than one such thing.

The figures herein follow a numbering convention in which the first digit corresponds to the drawing figure number and the remaining digits identify an element or component in the drawing. For example, reference numeral 100 may refer to element 102 in FIG. 1 and an analogous element may be identified by reference numeral 202 in FIG. 2. Elements shown in the various figures herein can be added, exchanged, and/or eliminated to provide additional examples of the disclosure. In addition, the proportion and the relative scale of the elements provided in the figures are intended to illustrate the examples of the disclosure, and should not be taken in a limiting sense.

The above specification, examples and data provide a description of the use of the system and method of the disclosure. Since many examples can be made without departing from the spirit and scope of the system and method of the disclosure, this specification merely sets forth some of the many possible examples and implementations.

What is claimed is:

1. A circuit board, comprising:
   a signal connector located on the circuit board; and
   cuts extending through at least a body of the circuit board that are adjacent to the signal connector and extend from a perimeter of the circuit board to an inner portion of the circuit board, wherein the circuit board flexes relative to the signal connector responsive to the circuit board experiencing a force.

2. The circuit board of claim 1, wherein the circuit board includes a tongue created by the cuts in the circuit board such that a remaining portion of the circuit board flexes relative to the tongue of the circuit board.

3. The circuit board of claim 2, wherein the signal connector is located on the tongue of the circuit board.

4. The circuit board of claim 1, wherein the cuts in the circuit board extend through an entire thickness of the body of the circuit board.

5. The circuit board of claim 1, wherein the cuts in the circuit board extending from the perimeter of the circuit board to the inner portion of the circuit board are the same length.

6. The circuit board of claim 1, wherein the cuts in the circuit board extending from the perimeter of the circuit board to the inner portion of the circuit board are a different length.

7. The circuit board of claim 1, wherein the cuts in the circuit board extend partially through a thickness of the body of the circuit board.

8. A system, comprising:
   a circuit board;
   a signal connector located on the circuit board; and
   cuts in the circuit board that are adjacent to the signal connector such that the cuts define a tongue of the circuit board, wherein the signal connector is located on the tongue of the circuit board such that the circuit board flexes relative to the tongue that includes the signal connector.

9. The system of claim 8, wherein the system includes a different circuit board including a different connector such that the signal connector located on the tongue of the circuit board connects to the different connector of the different circuit board.

10. The system of claim 9, wherein the circuit board is a printed circuit board (PCB).

11. The system of claim 9, wherein the circuit board is a printed circuit board assembly (PCBA).

12. The system of claim 8, wherein the circuit board flexes relative to the tongue that includes the signal connector responsive to the circuit board experiencing a force.

13. The system of claim 8, wherein trace electrical connections connecting the signal connector to components of the circuit board are routed around the cuts.

14. A device, comprising:
   a first circuit board including a first signal connector located on the first circuit board; and cuts in the first circuit board that extend through an entire thickness of the first circuit board and are adjacent to the first signal connector such that the cuts define a tongue of the first circuit board, wherein the first signal connector is located on the tongue of the first circuit board such that a remaining portion of the first circuit board flexes relative to the tongue that includes the first signal connector.

15. The device of claim 14, wherein the cuts in the first circuit board extend from a perimeter of the first circuit board to the inner portion of the first circuit board to define the tongue of the first circuit board.

16. The device of claim 14, wherein the remaining portion of the first circuit board flexes relative to the tongue such that trace electrical connections connecting the signal connector to components of the first circuit board are not damaged when the remaining portion of the first circuit board flexes relative to the tongue.

17. The device of claim 14, wherein the cuts in the first circuit board further comprise a first cut and a second cut, wherein the first cut and the second cut are at least one of:
 substantially parallel to each other; and
 substantially the same shape.

18. The device of claim 14, wherein the first circuit board includes a fan.

19. The device of claim 14, further comprising a second circuit board including a second signal connector located on the second circuit board, wherein the second signal connector is connected to the first signal connector such that the second circuit board is oriented in a substantially planar orientation to the first circuit board.

20. The device of claim 14, further comprising a second circuit board including a second signal connector located on the second circuit board, wherein the second signal connector is connected to the first signal connector such that the second circuit board is oriented substantially orthogonally to the first circuit board.

\* \* \* \* \*